United States Patent
Ghosh et al.

(10) Patent No.: US 10,017,855 B2
(45) Date of Patent: Jul. 10, 2018

(54) PROCESS KIT FOR A HIGH THROUGHPUT PROCESSING CHAMBER

(71) Applicant: Applied Materials, Inc., Santa Clara, CA (US)

(72) Inventors: Kalyanjit Ghosh, San Jose, CA (US); Mayur G. Kulkarni, Sunnyvale, CA (US); Sanjeev Baluja, Campbell, CA (US); Kien N. Chuc, Cupertino, CA (US); Sungjin Kim, Palo Alto, CA (US); Yanjie Wang, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 13 days.

(21) Appl. No.: 14/975,133

(22) Filed: Dec. 18, 2015

(65) Prior Publication Data

US 2016/0181088 A1 Jun. 23, 2016

Related U.S. Application Data (60) Provisional application No. 62/156,876, filed on May 4, 2015, provisional application No. 62/095,380, filed on Dec. 22, 2014.

(51) Int. Cl.
*H01L 21/00* (2006.01)
*C23C 16/44* (2006.01)
*H01J 37/32* (2006.01)

(52) U.S. Cl.
CPC ...... *C23C 16/4412* (2013.01); *C23C 16/4401* (2013.01); *H01J 37/32477* (2013.01)

(58) Field of Classification Search
CPC ............ C23C 16/4401; C23C 16/4412; H01J 37/32477
See application file for complete search history.

(56) References Cited

U.S. PATENT DOCUMENTS

| 6,884,297 B2 | 4/2005 | Park et al. |
| 9,127,362 B2 | 9/2015 | Scheible et al. |

(Continued)

FOREIGN PATENT DOCUMENTS

| KR | 20040085315 A | 10/2004 |
| KR | 20130062955 A | 6/2013 |

OTHER PUBLICATIONS

Written Opinion and International Search Report for PCT/US2016/022620 dated Jun. 27, 2016.

(Continued)

*Primary Examiner* — Dale E Page
*Assistant Examiner* — Quovaunda V Jefferson
(74) *Attorney, Agent, or Firm* — Patterson + Sheridan LLP (57) ABSTRACT

A processing chamber for processing a substrate is disclosed herein. In one embodiment, the processing chamber includes a liner assembly disposed within an interior volume of the processing chamber, and a C-channel disposed in an interior volume of the chamber, circumscribing the liner assembly. In another embodiment, a process kit disposed in the interior volume of the processing chamber is disclosed herein. The process kit includes a liner assembly, a C-channel, and an isolator disposed in the interior volume. The C-channel and the isolator circumscribe the liner assembly. A method for depositing a silicon based material on a substrate by flowing a precursor gas into a processing chamber is also described herein.

13 Claims, 8 Drawing Sheets

(56) References Cited

U.S. PATENT DOCUMENTS

| | | | |
|---|---|---|---|
| 2001/0004478 A1 | 6/2001 | Zhao et al. | |
| 2003/0198754 A1* | 10/2003 | Xi | C23C 16/45512 |
| | | | 427/576 |
| 2004/0187780 A1 | 9/2004 | Park et al. | |
| 2005/0150452 A1* | 7/2005 | Sen | C23C 16/4412 |
| | | | 118/715 |
| 2006/0051966 A1* | 3/2006 | Or | H01J 37/32082 |
| | | | 438/706 |
| 2007/0102286 A1 | 5/2007 | Scheible et al. | |
| 2007/0173059 A1 | 7/2007 | Young et al. | |
| 2008/0178801 A1 | 7/2008 | Pavloff et al. | |
| 2009/0272647 A1* | 11/2009 | Young | H01J 37/32623 |
| | | | 204/298.11 |
| 2011/0108524 A1* | 5/2011 | Dhindsa | H01J 37/32623 |
| | | | 216/59 |
| 2012/0205241 A1 | 8/2012 | Young et al. | |
| 2013/0206066 A1 | 8/2013 | Han et al. | |
| 2014/0262026 A1 | 9/2014 | Forster et al. | |
| 2015/0380223 A1 | 12/2015 | Scheible et al. | |

OTHER PUBLICATIONS

Written Opinion and International Search Report for PCT/US2016/023520 dated Jun. 24, 2016.

\* cited by examiner

PROCESS KIT FOR A HIGH THROUGHPUT PROCESSING CHAMBER

CROSS-REFERENCE TO RELATED APPLICATIONS

This application claims priority from U.S. Provisional Application Ser. No. 62/095,380, filed Dec. 22, 2014, and from U.S. Provisional Application Ser. No. 62/156,876, filed May 4, 2015, both of which are hereby incorporated by reference in their entirety.

BACKGROUND

Field

Embodiments described herein generally relate to a process kit for a semiconductor processing chamber, a semiconductor processing chamber having a process kit, and a method for depositing a silicon based material therein. More specifically, embodiments relate to a process kit including a liner assembly, a C-channel, and an isolator for use in a chemical vapor deposition chamber.

Description of the Related Art

In the fabrication of integrated circuits, deposition processes such as chemical vapor deposition (CVD) or plasma enhanced CVD processes are used to deposit films of various materials upon semiconductor substrates. During a CVD process, chemical reactions used for depositing a desired material take place in an enclosed process chamber. When the material is deposited on the substrate, residue comprising this material, as well as by-products of the CVD process, accumulates on the internal walls and other components of the process chamber. The residue builds up, as more substrates are processed in the chamber, and leads to generation of particles and other contaminants and, as such, to degradation of the deposited films. Consequently, it is recommended to clean the interior of the CVD chamber on a regular basis.

A process kit may be disposed in the chamber to help limit a processing volume to a desired region over the substrate in conjunction with a purge gas from a bottom of the chamber. The process kit typically includes one or more liners. The liners may be configured to assist in confining the plasma to the processing region and help prevent other components in the chamber from being contaminated with deposited materials. The bottom purge gas may be provided to the chamber to prevent process gases from depositing on the bottom of the chamber. However, conventional process kits may direct the purge gas in a manner that causes excessive wear and/or material deposits on the liners. The build-up of material on the liners increases the potential for substrate contamination during processing. Thus, the service interval of the process kit may be undesirably short to facilitate frequent cleaning.

Thus, there is a need for an improved process kit and CVD chamber having the same.

SUMMARY

Embodiments described herein generally relate to a process kit and processing chamber having the same. The processing chamber includes a chamber body having an interior volume, a lid enclosing the interior volume, a liner assembly disposed within the interior volume of the chamber body, and a C-channel disposed within the interior volume of the chamber body. The C-channel surrounds the liner assembly. The C-channel further includes a top annular portion, bottom annular portion, and middle annular portion. The top annular portion has a top surface and a bottom surface. The top surface has a plurality of openings formed therethrough. The bottom annular portion has a top surface and a bottom surface. The top surface of the bottom annular portion faces the bottom surface of the top annular portion. The middle annular portion connects the top annular portion and the bottom annular portion to form the C-channel. The top annular portion, the bottom annular portion, and the middle annular portion define a pumping region. The pumping region separates the bottom surface of the top annular portion from the top surface of the bottom annular portion. The pumping region is sealed by the liner assembly such that the plurality of openings formed in the top surface of the top annular portion extend through the top annular portion. Thus, the plurality of openings fluidly connects the interior volume of the chamber body with the pumping region.

In another embodiment a process kit for a processing chamber is disclosed herein. The process kit includes a liner assembly, a C-channel configured to circumscribe the liner assembly, and a T-liner configured to circumscribe the liner assembly. The C-channel further includes a top annular portion, a bottom annular portion, and a middle annular portion. The top annular portion has a top surface and a bottom surface. The top surface has a plurality of openings formed therethrough. The bottom annular portion has a top surface and a bottom surface. The top surface of the bottom annular portion faces the bottom surface of the top annular portion. The middle annular portion connects the top annular portion and the bottom annular portion to form a C-channel. The top annular portion, the bottom annular portion, and the middle annular portion define a pumping region. The pumping region separates the bottom surface of the top annular portion from the top surface of the bottom annular portion. The pumping region is bounded by the liner assembly when the liner assembly is disposed inside of the C-channel. The T-liner further includes a top annular portion and a bottom annular portion. The top annular portion has a top surface and a bottom surface. The bottom annular portion has a top surface and a bottom surface. The top surface of the bottom annular portion is coupled to the bottom surface of the top annular portion to form a t-shaped figure.

In another embodiment, a method related to depositing a silicon based material on a substrate is disclosed herein. A precursor gas is flowed into the processing chamber through a showerhead. The precursor gas is directed into a pumping channel through a plurality of vertical openings formed into a C-channel circumscribing the substrate. The precursor gas is pumped from the C-channel out of the processing chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Figure 1:
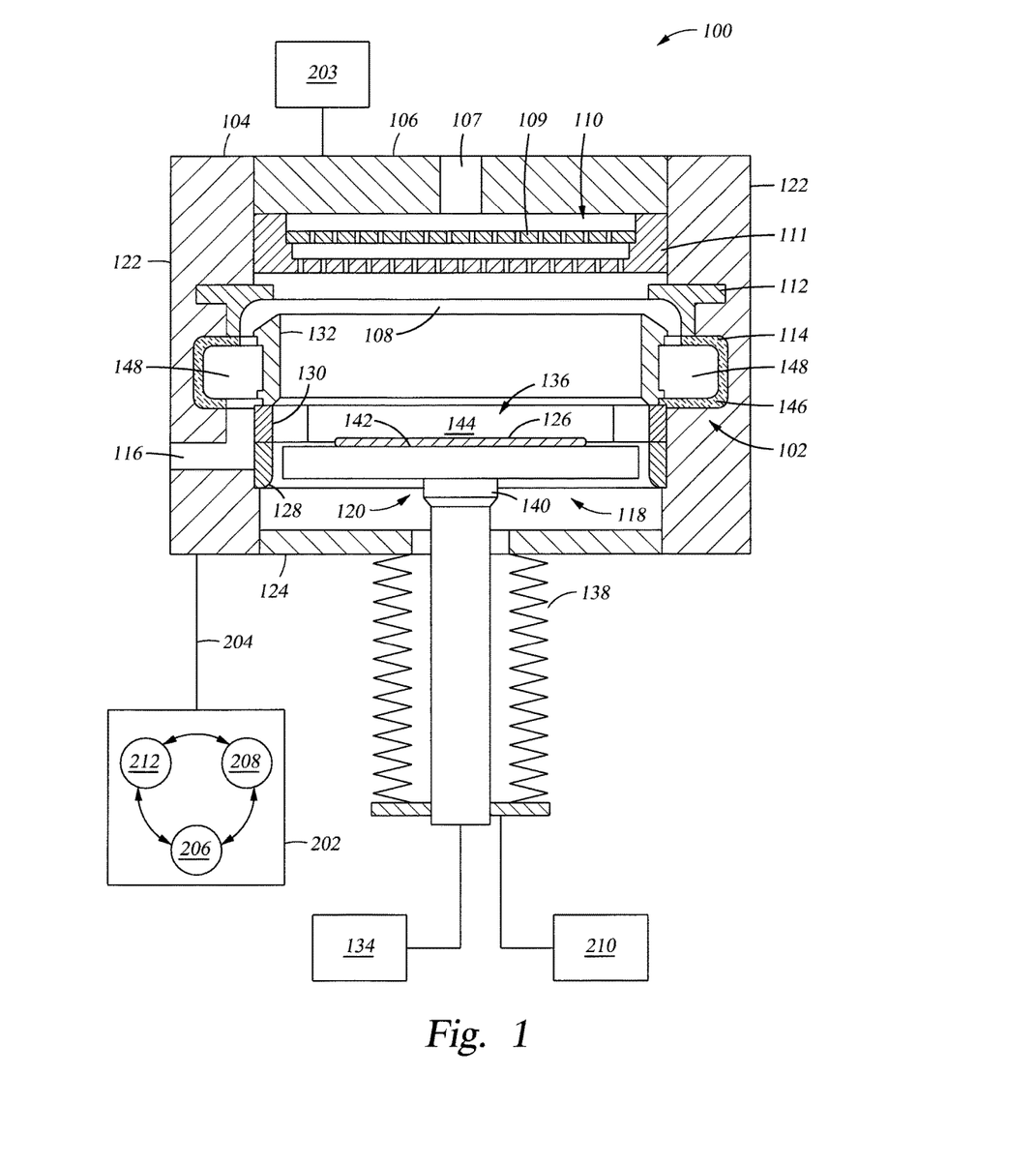
FIG. 1 schematically illustrates a processing chamber with a process kit, according to one embodiment.

FIG. 1 schematically illustrates a processing chamber 100 having a process kit 102 configured to reduce particle deposition thereon which advantageously reduces defects and increases the service interval. The processing chamber 100 includes a chamber body 104 having side walls 122 and a bottom 124, and a lid 106 disposed on the side walls 122. The side walls 122, bottom 124, and lid 106 define an interior volume 108 of the processing chamber 100. The processing chamber 100 includes a gas distribution assembly 110 and a pedestal assembly 120. In one embodiment, the gas distribution assembly includes a gas inlet 107, a blocker plate 109, and a face plate 111.

The pedestal assembly 120 is disposed in the interior volume and generally includes a substrate support 140. The substrate support 140 may be composed of aluminum or ceramic. The substrate support 140 may be an electrostatic chuck, a ceramic body, a heater, vacuum chuck, susceptor, or a combination thereof. The substrate support 140 has a substrate receiving surface 142 that receives and supports the substrate 126 during processing. The pedestal assembly 120 is coupled to the bottom 124 of the processing chamber 100 by a lift mechanism 134 that is configured to move the pedestal assembly 120 between a raised position (not shown) and lowered position 136. In the lowered position 136, lift pins (not shown) extend through the pedestal assembly 120 to space the substrate 126 from the pedestal assembly 120 to facilitate exchange of the substrate 126 with a substrate transfer mechanism (not shown) disposed exterior to the processing chamber 100, such as, for example, a robot. A bellows 138 is disposed between the pedestal assembly 120 and the chamber bottom 124 to isolate the interior volume 108 of the chamber body 104 from the interior of the pedestal assembly 120 and the exterior of the processing chamber 100.

The process kit 102 surrounds the pedestal assembly 120. The process kit 102 includes at least one or more of an isolator 112, a C-channel 114, and a liner assembly 118. The liner assembly 118 comprises a cylinder that serves to confine the energized process gas and to protect the side walls 122 of the processing chamber 100 from the energized process gas. The liner assembly 118 includes bottom liner 128, a middle liner 130, and a top liner 132. The bottom liner 128 rests on the bottom 124 of the chamber body 104. The middle liner 130 sits atop the bottom liner 128. The middle liner 130 further includes a slot 144 configured to allow a substrate 126 to pass through the middle liner 130 when being transferred into and out of the processing chamber 100. The top liner 132 sits atop the middle liner 130. The top liner 132, middle liner 130, and bottom liner 128 form a continuous surface bounding a portion of the interior volume 108 of the processing chamber 100. The liner assembly is discussed with more detail in FIG. 5.

The C-channel 114 includes an annular body 146 and a pumping region 148. The C-channel 114 is disposed within the chamber body 104 and surrounds both the liner assembly 118 and the pedestal assembly 120.

Figure 3A:
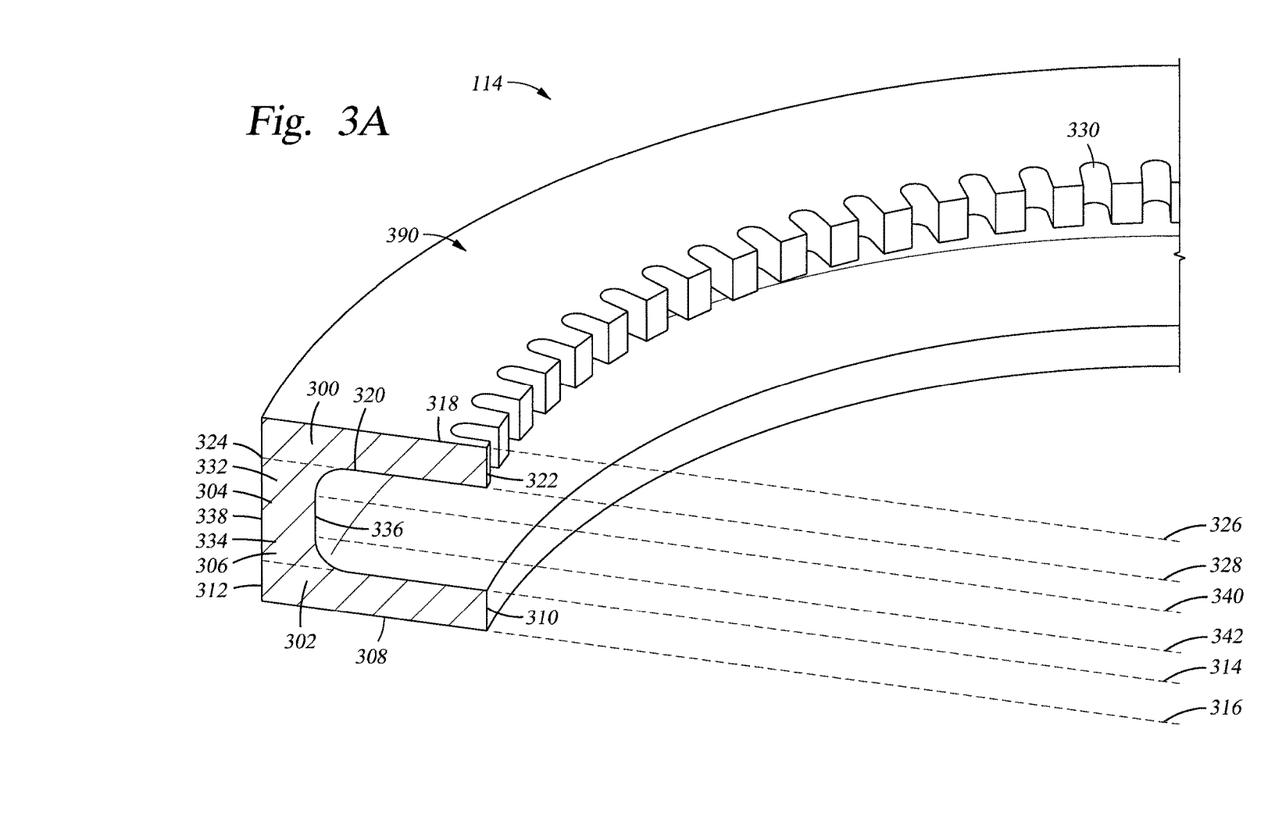
FIG. 3A is an enlarged view of the C-channel of the process kit, according to one embodiment.

FIG. 3A is an enlarged view of the C-channel 114. The annular body 146 includes a top annular portion 300, a bottom annular portion 302, and a middle annular portion 304. The top and bottom annular portions 300, 302 may be elongated and substantially parallel. The middle annular portion 304 is perpendicular to both the top annular portion 300 and the bottom annular portion 302, and connects the radially outward edges of the top annular portion 300 and the bottom annular portion 302 to form the C-channel 114. The bottom annular portion 302 further includes a top surface 306, a bottom surface 308, an inner wall 310, and an outer wall 312. The top surface 306 is substantially parallel to the bottom surface 308. The outer wall 312 is perpendicular to the top and bottom surfaces 306, 308, and further includes an outer diameter 314. The inner wall 310 is substantially parallel to the outer wall 312, and includes an inner diameter 316 such that the inner diameter 316 is less than the outer diameter 314.

Figure 3B:
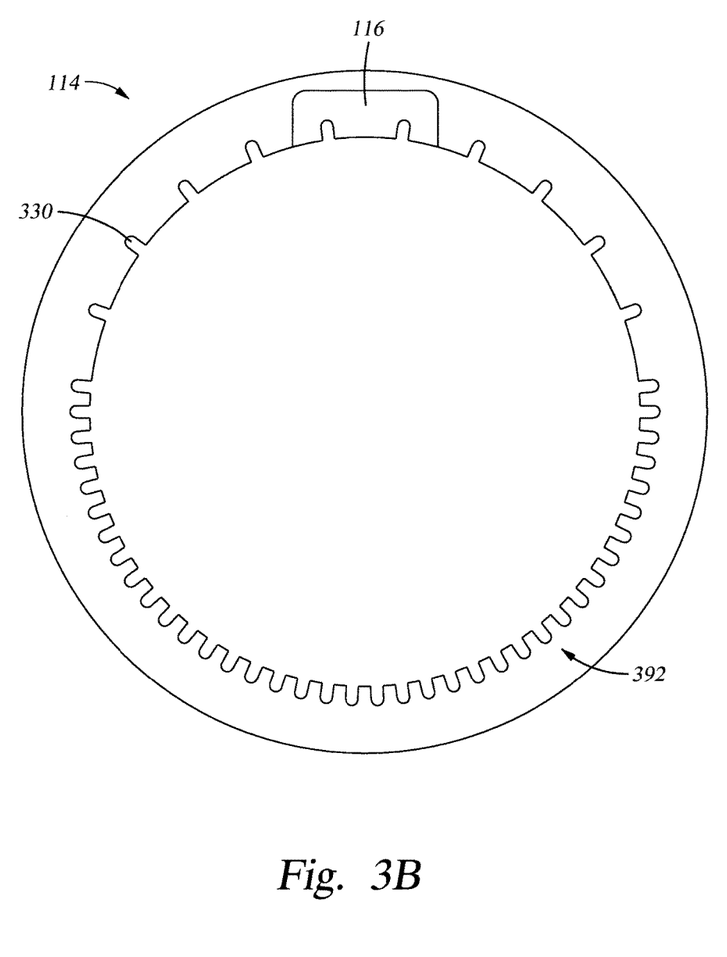
FIG. 3B is top view of the C-channel of the process kit, according to one embodiment.

The top annular portion 300 includes a top surface 318, a bottom surface 320, an inner wall 322, and an outer wall 324. The top surface 318 is substantially parallel to the bottom surface 320. The bottom surface 320 of the top annular portion 300 faces the top surface 306 of the bottom annular portion 302. A plurality of openings 330 extends through the top annular portion 300, connecting the top surface 318 and the bottom surface 320. The openings 330 may be holes, slots or other type of feature that allow gas to flow by or through the top annular portion 300. In one embodiment, the openings 330 may be arranged in an equally spaced pattern 390 about the top surface 318 to provide uniform gas flow across the substrate. In another embodiment, as shown in FIG. 3B, the openings 330 may be positioned to exhibit an asymmetric pattern 392 about the top surface 318. The asymmetric pattern 392 may be in the form of an asymmetric distribution of the number of openings 330 around the top annular portion 300, or an asymmetric distribution of the open area of openings 330 around the top annular portion 300. In one embodiment, the openings 330 in FIG. 3B may be less concentrated near the location of the pumping channel, and more concentrated opposite the pumping channel.

Referring back to FIG. 3A, the outer wall 324 is perpendicular to the top and bottom surfaces 318, 320, and further includes an outer diameter 328. The outer diameter 328 of the top annular portion 300 is substantially equal to the outer diameter 314 of the bottom annular portion 302. The inner wall 322 is substantially parallel to the outer wall 324, and includes an inner diameter 326. The inner diameter 326 of the top annular portion 300 is substantially equal to the inner diameter 316 of the bottom annular portion 302.

The middle annular portion 304 includes a top edge 332, a bottom edge 334, an inner wall 336, and an outer wall 338. The top edge 332 of the middle annular portion 304 is substantially parallel to the bottom edge 334, and is coupled to the bottom surface 320 of the top annular portion 300. The bottom edge 334 of the middle annular portion 304 is coupled to the top surface 306 of the bottom annular portion 302. The outer wall 338 of the middle annular portion 304 is perpendicular to the top edge 332 and the bottom edge 334 of the middle annular portion 304. The outer wall 338 of the middle annular portion 304 is integral with the outer wall 324 of the top annular portion 300 and the outer wall 312 of the bottom annular portion 302. The outer wall 338 has an outer diameter 342, wherein the outer diameter 342 is substantially equal to the outer diameter 328 of the top annular portion 300 and the outer diameter 314 of the bottom annular portion 302. The inner wall 336 is substantially parallel to the outer wall 338, and further includes an inner diameter 340. The inner diameter 340 of the middle annular portion 304 is less than the inner diameter 326 of the top annular portion 300 and the inner diameter 316 of the bottom annular portion 302.

Figure 2:
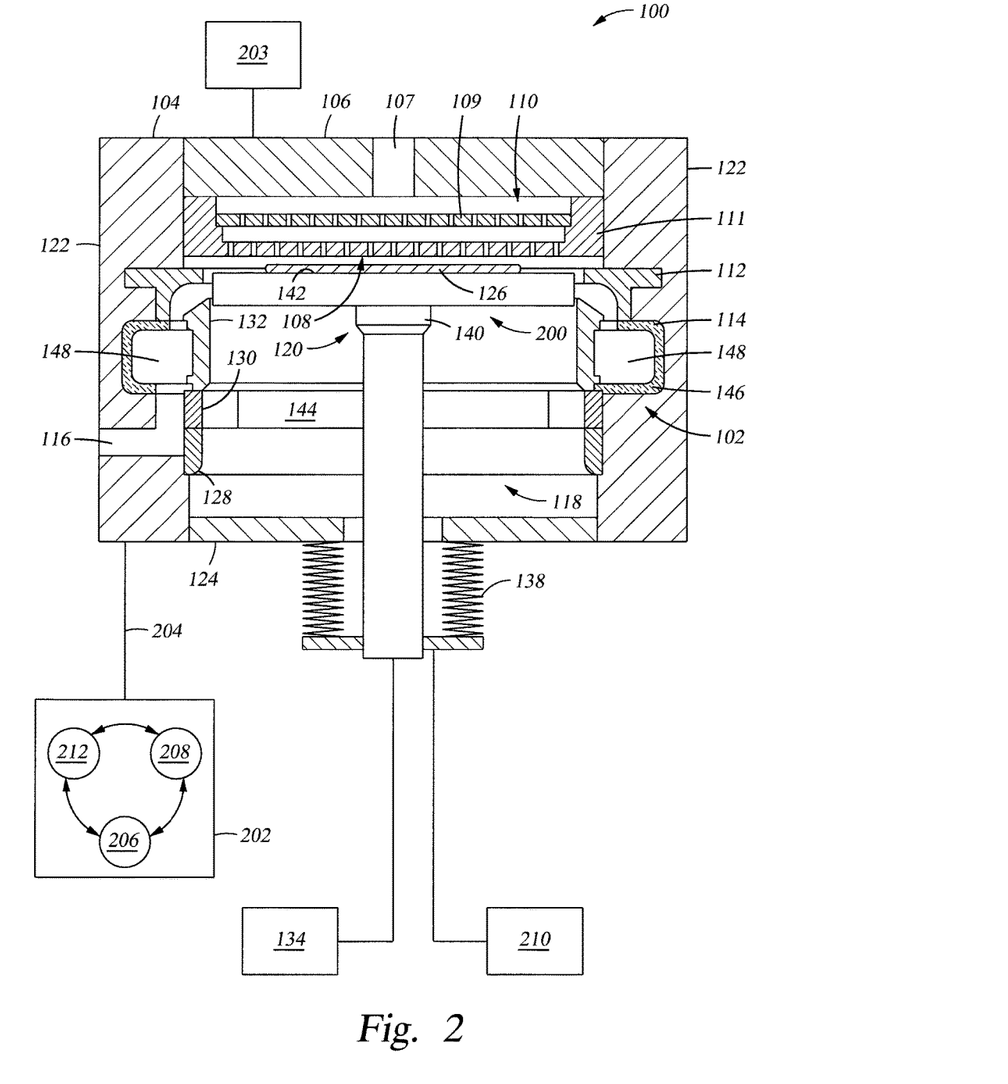
FIG. 2 schematically illustrates a cross sectional view of the process kit of FIG. 1 with a substrate support in an extended position.

The bottom surface 320 of the top annular portion 300, the inner wall 336 of the middle annular portion 304, and the top surface 306 of the bottom annular portion 302 define a pumping region 148. The plurality of openings 330 in the top surface 318 of the top annular portion 300 provides a fluid communication between the interior volume 108 of the processing chamber 100 and the pumping region 148. During processing, the C-channel 114 sits below the pedestal assembly (as shown in FIG. 2) when the pedestal assembly is in the raised position. The pumping region 148 is configured to receive the process gas exiting the interior volume 108 of the processing chamber 100 through the plurality of openings 330 formed through the top surface 318 of the top annular portion 300. The pumping region 148 is separated from the interior volume 108 of the chamber body 104 by the outer edge of the top liner 132 (as shown in FIG. 1), which abuts the inner walls 310, 322, 336. The process gas exits the pumping region 148 through an exhaust port (not shown) defined through the bottom surface 308 of the bottom annular portion 302. The process gas then exits the chamber body 104 through a pumping port 116.

Referring back to FIG. 1, the isolator 112 is disposed in the interior volume 108 of the processing chamber 100. The isolator 112 surrounds the pedestal assembly 120 and the liner assembly 118. The isolator 112 extends above the liner assembly 118, and aids in directing the process gas across the substrate 126 and into the pumping region 148 defined in the annular body 146 of the C-channel 114. In one embodiment, such as that shown in FIG. 1, the isolator 112 has a t-shaped body.

Figure 4:
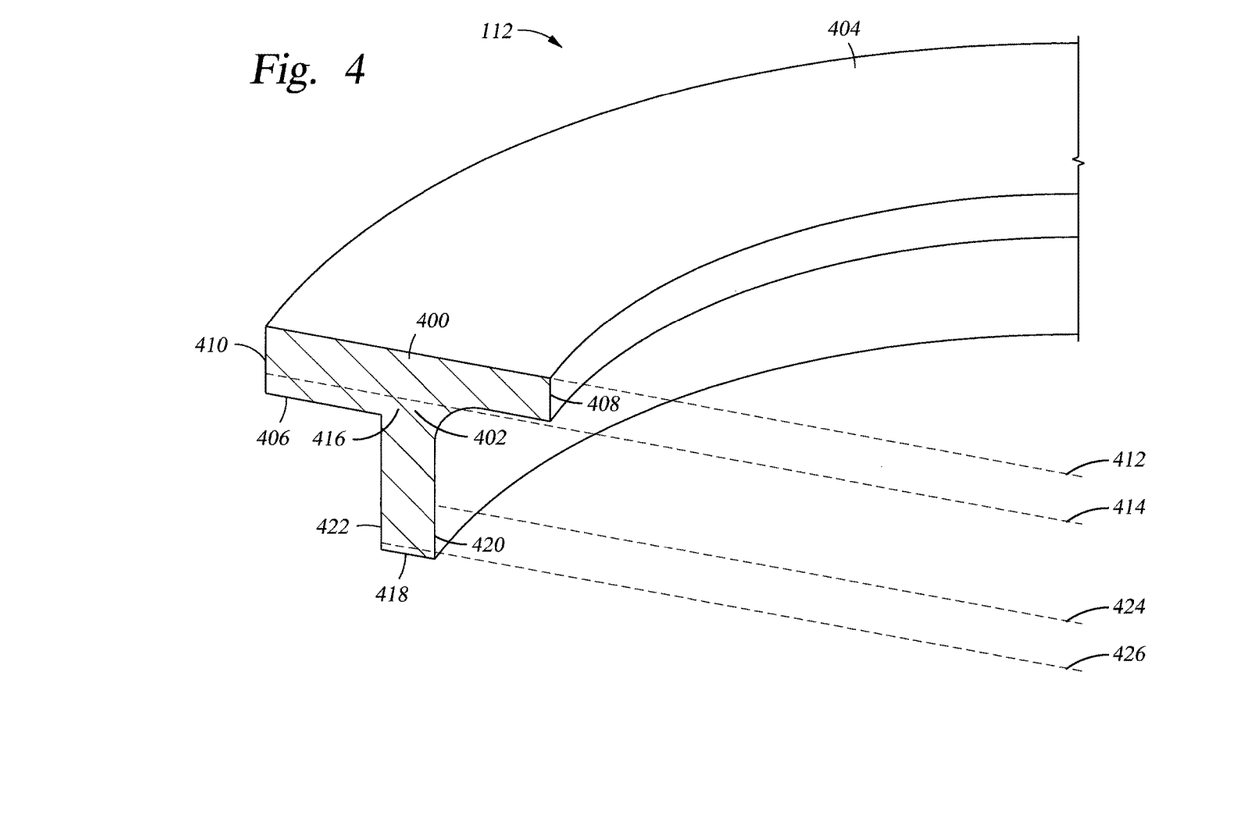
FIG. 4 is an enlarged view of the isolator of the process kit, according to one embodiment.

FIG. 4 shows an enlarged view of the isolator 112. The isolator 112 includes a top annular body 400 and a bottom annular body 402. The top annular body 400 includes a top surface 404, a bottom surface 406, an inner wall 408, and an outer wall 410. The top surface 404 is substantially parallel to the bottom surface 406. The inner wall 408 is perpendicular to the top and bottom surfaces 404, 406, and further includes an inner diameter 412. The outer wall 410 is substantially parallel to the inner wall 408, and includes an outer diameter 414, wherein the outer diameter 414 is larger than the inner diameter 412.

The bottom annular body 402 includes a top surface 416, a bottom surface 418, an inner wall 420, and an outer wall 422. The top surface 416 of the bottom annular body 402 is coupled to the bottom surface 406 of the top annular body 400 such that the two bodies 400, 402 form a t-shape. The top surface 416 of the bottom annular body 402 is substantially parallel to the bottom surface 418. The inner wall 420 is substantially perpendicular to both the top surface 416 and the bottom surface 418, and further includes an inner diameter 424. The inner diameter 424 is larger than the inner diameter 412 of the inner wall 408 of the top annular body 400. The outer wall 422 is substantially parallel to the inner wall 420, and further includes an outer diameter 426. The outer diameter 426 is greater than the inner diameter 424 of the bottom annular body 402 and less than the outer diameter 414 of the top annular body 400.

The bottom surface 406 of the top annular body 400 is integral with the inner wall 420 of the bottom annular body 402. The integrated surface may be curved in such a way as to direct the process gas into the C-channel (not shown) for exhaust. The bottom surface 406 of the top annular body 400 is also integral with the outer wall 422 of the bottom annular body 402. The integrated surfaces are configured to contact a peripheral edge of the lid assembly (as shown in FIG. 1).

FIG. 2 illustrates a cross-sectional view of the processing chamber 100 with the pedestal assembly 120 in a raised position 200. In the raised position 200, the process kit 102 disposed therein helps limit the processing volume to over the pedestal assembly 120. Thus, the process kit 102 aids in keeping the bottom of the chamber clean. Consequently, the process kit 102 aids in reducing the overall clean time.

A controller 202 is coupled to the processing chamber 100 and communicates with the motion mechanism via a communication cable 204 to raise or lower the pedestal assembly 120. The controller 202 is operable to control processing of the substrate 126 within the processing chamber 100. The controller 202 includes a programmable central processing unit (CPU) 206 that is operable with a memory 208 and a mass storage device, an input control unit, and a display unit (not shown), such as power supplies, clocks, cache, input/output (I/O) circuits, and the like, coupled to the various components of the processing chamber 100 to facilitate control of the processes of processing a substrate 126. The controller 202 may also include hardware for monitoring the processing of the substrate 126 through sensors (not shown) in the processing chamber 100.

To facilitate control of the processing chamber 100 and processing the substrate 126, the CPU 206 may be one of any form of general purpose computer processors for controlling the substrate process. The memory 208 is coupled to the CPU 206 and the memory 208 is non-transitory and may be one or more of readily available memory such as random access memory (RAM), read only memory (ROM), floppy disk drive, hard disk, or any other form of digital storage, local or remote. Support circuits 212 are coupled to the CPU 206 for supporting the CPU 206 in a conventional manner. The process for processing the substrate 126 is generally stored in the memory 208. The process for processing the substrate 126 may also be stored and/or executed by a second CPU (not shown) that is remotely located from the hardware being controlled by the CPU 206.

The memory 208 is in the form of computer-readable storage media that contains instructions, that when executed by the CPU 206, facilitates the operation of processing the substrate 126 in the processing chamber 100. The instructions in the memory 208 are in the form of a program product such as a program that implements the operation of processing the substrate 126. The program code may conform to any one of a number of different programming languages. In one example, the disclosure may be implemented as a program product stored in computer readable storage media for use with a computer system. The program(s) of the program product define functions of the embodiments. Illustrative computer-readable storage media include, but are not limited to: (i) non-writable storage media (e.g., read-only memory devices within a computer such as CD-ROM disks readable by a CD-ROM drive, flash memory, ROM chips or any tope of solid-state non-volatile semiconductor memory) on which information is permanently stored; and (ii) writing storage media (e.g. floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

In the raised position 200, the lift mechanism 134 raises the substrate support 140 to a height, h, within the interior volume 108 of the processing chamber 100. The height may be, for example, such that there is about a 2 mm radial gap between the top liner 132 and the substrate support 140, and about a 5 mm gap between the isolator 112 and the substrate support 140. A substrate (not shown) is positioned on the substrate support 140 at a vertical height such that the slits line up along the side of the substrate. The bottom of the substrate lies below the top surface of the top liner to prevent any flow of the process gases below the pedestal assembly 120. During processing, the controller 202 communicates with the processing chamber 100 to flow a process gas from a process gas source 203 into the interior volume 108 of the processing chamber 100 for depositing a material on a substrate 126. The deposited material may be a dielectric material, such as a silicon based dielectric material. The gas distribution assembly 110 provides the process gas to the interior volume 108. The process gas may be, for example, TEOS. To aid in keeping the lower region of the processing chamber 100 clean, a purge gas may be flowed through the interior volume 108 of the processing chamber 100 from below the pedestal assembly 120. The purge gas is introduced by a separate gas line 210 through the bottom 124 of the processing chamber 100. The purge gas helps minimize undesirable deposition on the side walls 122 of the processing chamber 100 and the area of the processing chamber 100 below the pedestal assembly 120. The purge gas may be an inert gas, such as, for example, nitrogen, or argon.

After processing, both the process gas and the purge gas are exhausted from the interior volume 108 of the processing chamber 100. The isolator 112 directs the process gas and the purge gas downwards, towards the plurality of openings 330 (shown in FIGS. 3A and 3B) in the upper surface of the C-channel 114. Once the process gas and the purge gas enter the pumping region 148, the gases are flowed out of pumping region 148 through an exhaust port (not shown) defined in the bottom surface 308 of the bottom annular portion 302. The gases then exit the chamber body 104 through a pumping port 116.

Figure 5:
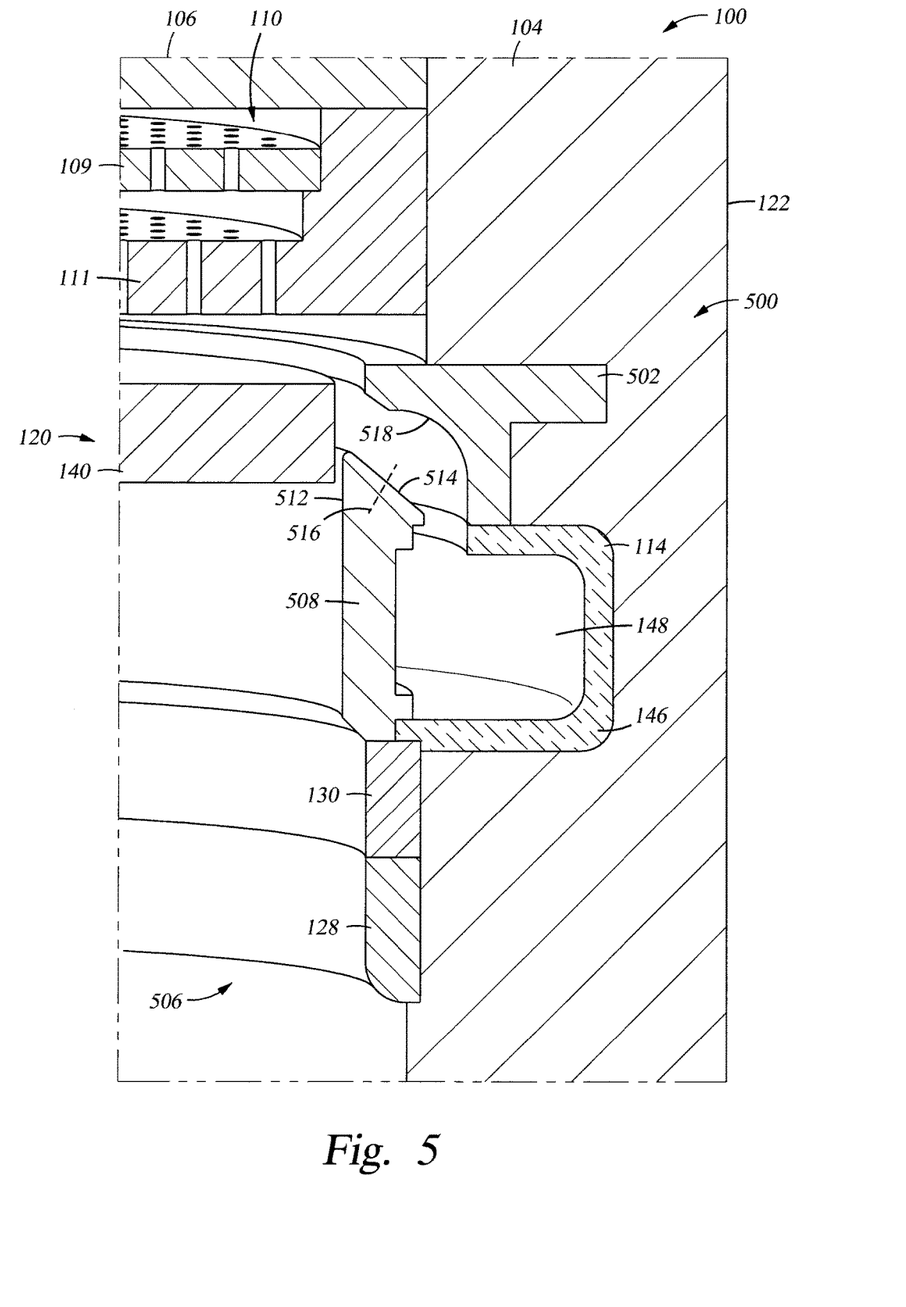
FIG. 5 is an enlarged view of one embodiment of the process kit in the processing chamber, according to one embodiment.

FIG. 5 illustrates an enlarged cross sectional view of one embodiment of the process kit 500 in processing chamber 100. The process kit 500 includes an isolator 502, the C-channel 114, and a liner assembly 506, the liner assembly 506 having a top liner 508, a middle liner (not shown), and bottom liner (not shown). The top liner 508 may be a cylinder that serves to confine the process gas and to protect the side walls 122 from the process gas. The top liner 508 further includes an outer wall 512 and a top surface 514. The outer wall 512 and top surface 514 intersect at a radius 516. The radius controls the curvature or edge blend of the top liner. For example, the intersection of the outer wall 512 and the top surface 514 may have a radius of 25 mm. The geometrical configuration of where the isolator 502 meets the top liner 508 substantially prevents accumulation of deposition material on the process kit 500. The edge of the top liner (as shown in FIGS. 1 and 2) is modified to have a steeper slope to prevent flow recirculation behind it. Additionally, the inner wall 518 of the isolator 502 may be shaped to discourage gas from accumulating on the top liner 508. For example, the inner walls 518 of the isolator 502 may include a 35 mm chamfer to aid in preventing flow recirculation behind the isolator 502.

During processing, a bottom purge is utilized to prevent contamination of the region of the chamber below the pedestal assembly from process gases. The bottom purge helps to significantly reduce the time required to clean the processing chamber 100. The configuration of the isolator 502 and the top liner 508 directs the purge gas to the area between the isolator 502 and the top liner 508, which substantially reduces recirculation on the top liner and substantially prevents powder residues.

Figure 6:
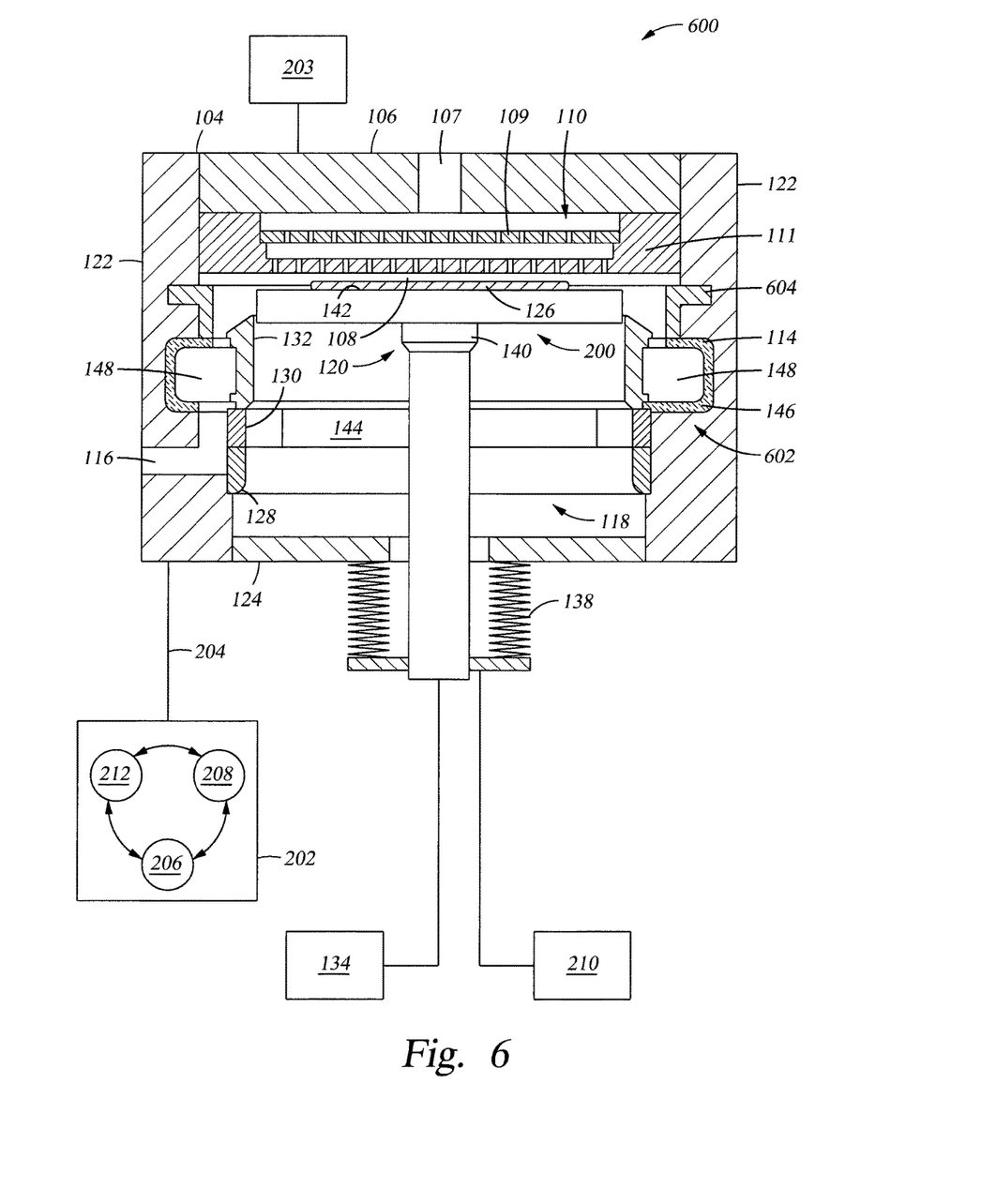
FIG. 6 schematically illustrates a cross sectional view of the processing chamber with a process kit, according to one embodiment.

FIG. 6 illustrates another embodiment of the processing chamber 100. The processing chamber 100 includes a process kit 600 configured to reduce particle deposition thereon which advantageously reduces defects and increases the service interval.

The process kit 602 surrounds the pedestal assembly 120. The process kit 602 includes at least one or more of an isolator 604, a C-channel 114, and a liner assembly 118. In one embodiment, such as that shown in FIG. 6, the isolator 604 has an L-shape. The L-liner is disposed in the interior volume 108 of the processing chamber 100. The isolator 604 surrounds the pedestal assembly 120 and the liner assembly 118. The isolator 604 extends above the liner assembly 118. The isolator 604 aids in directing the process gas across the substrate 126 and into the pumping region 148 defined in the annular body 146 of the C-channel 114.

Figure 7:
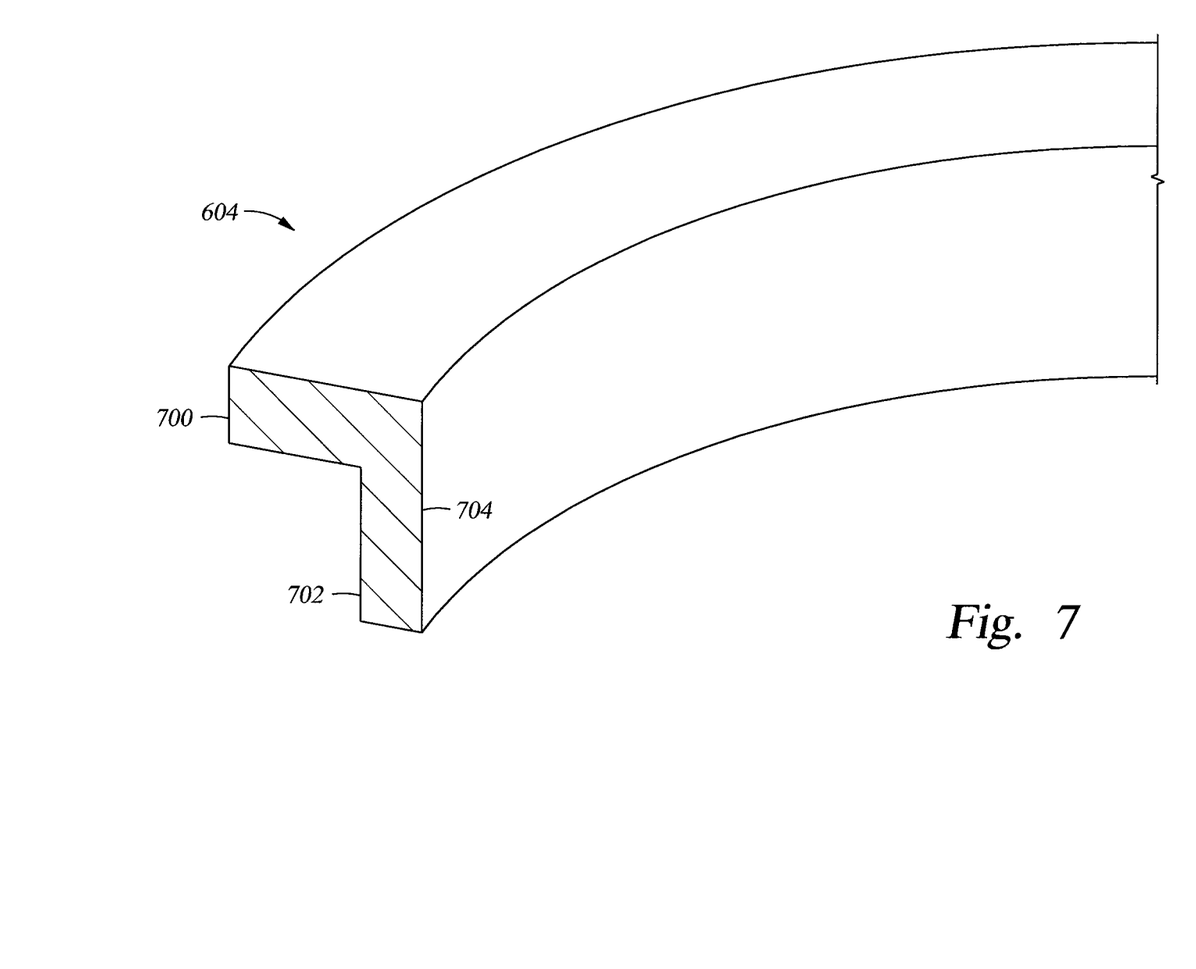
FIG. 7 is an enlarged view of the isolator of the process kit, according to one embodiment.

FIG. 7 shows an enlarged view of one embodiment of the isolator 604. The isolator 604 includes a top annular body 700 and a bottom annular body 702. The top annular body 700 is coupled to the bottom annular body 702 to form an L-shape. The isolator 604 further includes an inner surface 704. The inner surface 704 is formed by the top annular body 700 and the bottom annular body 702. The inner surface 704 is configured to receive plasma buildup during processing. The inner surface 704 is spaced from the pedestal assembly such that the plasma buildup is separated farther from the surface of the substrate. The increased distance between the inner surface 704 and the substrate decreases the likelihood that plasma buildup will fall onto the surface of the substrate.

While the foregoing is directed to specific embodiments, other and further embodiments may be devised without departing from the basic scope thereof, and the scope thereof is determined by the claims that follow.

What is claimed is:

1. A processing chamber for processing a substrate, the processing chamber comprising:
    a chamber body having an interior volume;
    a lid for enclosing the interior volume;
    a liner assembly disposed within the interior volume of the chamber body; and
    a C-channel disposed within the interior volume of the chamber body and surrounding the liner assembly, the C-channel further comprising:
        a top annular portion having a plurality of openings formed from a top surface of the top annular portion to a bottom surface of the top annular portion;
        a bottom annular portion facing the top annular portion;
        a middle annular portion connecting the top annular portion and the bottom annular portion to form a c-shaped body, the top annular portion, the bottom annular portion, and the middle annular portion defining a pumping region, the pumping region fluidly coupled to the interior volume through the plurality of openings formed through the top annular portion; and an exhaust port formed in the bottom surface of the bottom annular portion, wherein a first portion of the plurality of openings disposed in a first region adjacent to the exhaust port has a first density and a second portion of the plurality of openings disposed in a second region opposite the first region has a second density greater than the first density.

2. The processing chamber of claim 1, wherein the liner assembly further comprises:
   a bottom liner disposed on a bottom of the processing chamber;
   a middle liner disposed on the bottom liner; and
   a top liner disposed on the middle liner, the bottom liner, the middle liner, and the top liner forming a continuous surface.

3. The processing chamber of claim 2, wherein the top liner further comprises:
   an outer wall; and
   a top surface substantially perpendicular to the outer wall, the top surface and the outer wall intersecting at a radius.

4. The processing chamber of claim 3, wherein the radius is 25 mm.

5. The processing chamber of claim 1 further comprising: an isolator.

6. The processing chamber of claim 5, wherein the isolator is L-shaped.

7. The processing chamber of claim 5, wherein the isolator is T-shaped.

8. A process kit for use in an interior volume of a processing chamber, the process kit comprising:
   a liner assembly configured to line an interior volume of a processing chamber;
   a C-channel sized to circumscribe the liner assembly, the C-channel further comprising:
      a top annular portion having a plurality of openings formed from a top surface of the top annular portion to a bottom surface of the top annular portion;
      a bottom annular portion facing the top annular portion;
      a middle annular portion connecting the top annular portion and the bottom annular portion to for a c-shaped body, the top annular portion, the bottom annular portion, and the middle annular portion defining a pumping region, the pumping region fluidly coupled to the interior volume through the plurality of openings formed through the top annular portion; and
      an exhaust port formed in the bottom surface of the bottom annular portion, wherein a first portion of the plurality of openings disposed in a first region adjacent to the exhaust port has a first density and a second portion of the plurality of openings disposed in a second region opposite the first region has a second density greater than the first density; and
   an isolator configured to circumscribe the liner assembly.

9. The process kit of claim 8, wherein the liner assembly further comprises:
   a bottom liner disposed on a bottom of the processing chamber;
   a middle liner disposed atop the bottom liner and coupled thereto; and
   a top liner disposed atop the middle liner and coupled thereto, the bottom liner, the middle liner, and the top liner forming a continuous surface having an outer diameter smaller than an inner diameter of the C-channel.

10. The process kit of claim 9, wherein the top liner further comprises:
    an outer wall; and
    a top surface substantially perpendicular to the outer wall, the top surface and the outer wall intersecting at a radius.

11. The process kit of claim 10, wherein the radius is 25 mm.

12. The process kit of claim 8, wherein the isolator is L-shaped.

13. The process kit of claim 8, wherein the isolator is T-shaped.

* * * * *